United States Patent [19]

Miyoshi

[11] 4,342,093

[45] Jul. 27, 1982

[54] METHOD OF DIGITAL LOGIC SIMULATION

[75] Inventor: Masayuki Miyoshi, Hadano, Japan

[73] Assignee: Hitachi, Ltd., Tokyo, Japan

[21] Appl. No.: 149,547

[22] Filed: May 13, 1980

[30] Foreign Application Priority Data

May 15, 1979 [JP] Japan ................................. 54-59354

[51] Int. Cl.³ ............................................. G06F 15/20
[52] U.S. Cl. ...................................... 364/578; 371/23
[58] Field of Search .......................... 364/578; 371/23; 324/73 R

[56] References Cited

U.S. PATENT DOCUMENTS 3,927,371 12/1975 Pomeranz et al. ................. 371/23 X

OTHER PUBLICATIONS

E. G. Ulrich, "Exclusive Simulation of Activity in Digital Networks", *Communications of the ACM*, vol. 12, No. 2, Feb. 1969, pp. 102–110.
J. R. Armstrong et al., "Chip-Level Simulation of Microprocessors", *Computer*, vol. 13, No. 1, Jan. 1980, pp. 94–100.
S. A. Szygenda et al., "Digital Logic Simulation in a Time–Based, Table–Driven Environment Part 1. Design Verification", *Computer*, vol. 8, No. 3, Mar. 1975, pp. 24–36.

*Primary Examiner*—Jerry Smith
*Attorney, Agent, or Firm*—Craig and Antonelli

[57] ABSTRACT

A logic simulation is executed using a real circuit as a part of a simulation model of a logic circuit subjected to the logic simulation. The simulation model is formed of the real circuit and a simulation circuit, and the operation of the real circuit and the logic simulation of the simulation circuit are performed alternately. The operation of the real circuit is performed in response to an input signal thereto representing the condition of the output node of the simulation circuit, while the logic simulation of the simulation circuit is executed in response to a stimulus in the form of an output signal of the real circuit which is applied to the input node of the simulation circuit.

2 Claims, 3 Drawing Figures

METHOD OF DIGITAL LOGIC SIMULATION

BACKGROUND OF THE INVENTION

This invention relates to a method of simulation of a digital logic circuit.

The simulation of a digital logic circuit has in the past been effected by a general-purpose computer in software fashion. Examples of such logic simulation are disclosed in the literatures listed below:
- (a) "Exclusive simulation of activity in digital networks" by Ernst G. Ulrich, February 1969, Communications of the ACM, Vol. 12, No. 2, pp. 102 to 110; and
- (b) "Digital Logic Simulation In a Time-Based, Table-Driven Environment Part 1, Design Verification" by S. A. Szygenda and E. W. Thomson, March 1975, Computer, Vol. 8, No. 3, pp. 24 to 36.

The logic simulation is effected by forming a logic simulation circuit or simulation model in software fashion. In simulating a logic circuit L comprising an integrated circuit IC as shown in FIG. 1, for instance, a logic circuit equivalent to the integrated circuit IC is formed by the use of an AND gate, an OR gate and other basic circuits in software fashion. In this manner an output in response to an input stimulus for the AND and OR gates is calculated. Although this technique is quite useful, there are certain problems. For example, in the event that it is impossible to replace an integrated circuit making up a component element of a logic circuit by an equivalent logic circuit comprising such basic circuits as an AND gate and an OR gate, it is impossible to form a simulation circuit or simulation model for such a logic circuit. Therefore the logic simulation is impossible or, at least, unsatisfactory. In particular, in the case of microprocessors presently available on the market which have a very high degree of integration (and to which the internal logic circuit diagrams are not generally made public), it is very difficult to obtain an equivalent logic circuit utilizing simply an AND gate and an OR gate. As a result, the logic simulation of a logic circuit using a microprocessor is far from complete. An example of a prior art attempt at simulation of a microprocessor is disclosed in "Chip-Level Simulation of Microprocessors" by James R. Armstrong and Garry W. Woodruss, January 1980, Computer, Vol. 13, No. 1 pp. 94 to 100.

In addition to the abovementioned problem, if the logic circuit is complicated, logic simulation by use of a general-purpose computer requires a very long time for the computer processing necessary for logic simulation. This tends to be the case even when the computer program instructions for computation of an output in response to an input stimulus of the basic circuits such as AND and OR gates are executed at a very high speed.

SUMMARY OF THE INVENTION

Accordingly, it is an object of the present invention to provide a method of easily effecting simulation of a logic circuit comprising a high-density integrated circuit such as is formed in microprocessors available on the market which cannot be easily replaced by an equivalent logic circuit including such basic circuits as AND gates, OR gates and NAND gates.

To achieve this and other objects, a feature of the method of simulation according to the present invention lies in the fact that a real circuit is used as a part of a simulation model for a logic circuit intended for logic simulation. An actual integrated circuit, for example, is used as the large scale integration (LSI) circuit portion of the logic circuit intended for logic simulation, while a simulation circuit is formed in software fashion for the remaining parts thereof. Therefore a simulation model of the logic circuit intended for simulation is formed of a real circuit and a simulation circuit or program-simulated circuit. The simulation of the simulation model is effected by carrying out the operation of the real circuit and simulation of the simulation (program-simulated) circuit alternately. The operation of the real circuit is performed by using an output node of the simulation circuit as an input signal to the real circuit. The simulation of the simulation circuit, on the other hand, is carried out by using an output signal of the real circuit as a stimulus for the input node of the simulation circuit.

According to the present invention, in view of the fact that a real circuit is used as part of a simulation model, it is easy to simulate a logic circuit including a highly integrated circuit which cannot be easily expressed in the form of an equivalent logic circuit including such basic circuits as an AND gate or an OR gate. Further, for the real circuit portion, it is not necessary to process the program instruction for calculating the output in response to the input stimulus. This serves to reduce the processing time for the logic simulation.

DESCRIPTION OF THE PREFERRED EMBODIMENT

Figure 1:
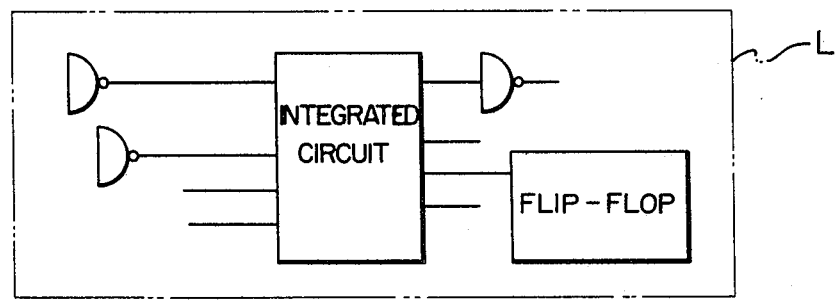
FIG. 1 is a diagram showing a general configuration of a logic circuit intended for logic simulation.
Figure 2:
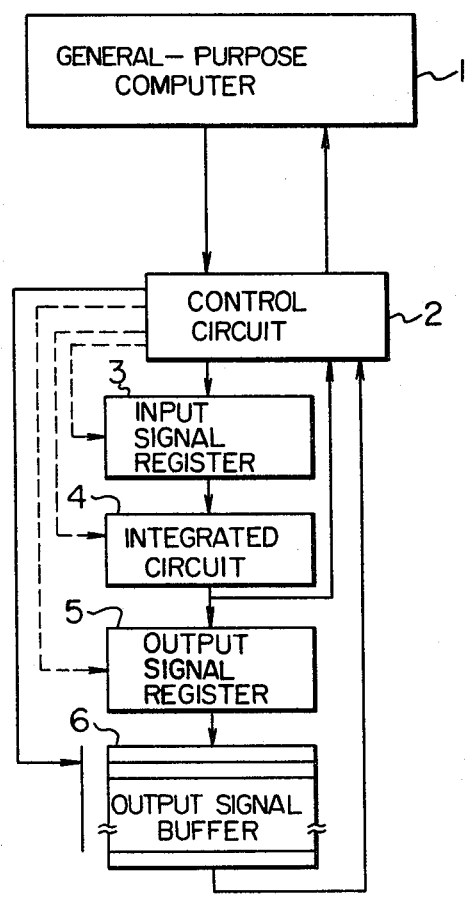
FIG. 2 is a block diagram showing an embodiment of the present invention.

Referring to FIG. 2, an integrated circuit 4 is included in an actual logic circuit intended for simulation. For the parts of the logic circuit to be simulated other than this integrated circuit 4, a simulation circuit is formed by a general-purpose computer 1 in software fashion. Thus a simulation model of the logic circuit to be simulated comprises a real circuit portion constituted by the integrated circuit 4 and a simulation circuit portion formed in software fashion utilizing the general-purpose computer 1. A control circuit 2, which is controlled by a logic simulation program executed in a general-purpose computer 1, sets into an input signal register 3 the condition of the output node of the simulation circuit by logic simulation transmitted from the general-purpose computer 1, thereby activating the integrated circuit 4. The control circuit 2 also monitors the output signal of the integrated circuit 4. When the control circuit 2 senses a change in the output signal of the integrated circuit 4, it sets this indication into an output signal register 5 on the one hand and stores the content of the output signal register 5 in ann output signal buffer 6 on the other hand. Output signals of the integrated circuit 4 produced after activation thereof are stored in the output signal buffer 6 together with the time of change after such an activation. By adopting a method in which the output signal of the integrated circuit 4 is stored in the buffer 6 together with the time of change thereof only when the output signal so changes, the capacity of the buffer 6 can be desirably reduced. Even when the output signal of the integrated circuit 4 does not change, it may be stored in the buffer 6 time-sequentially in accordance with predetermined timing intervals. In this case, the capacity of the buffer 6 is required to be increased. In any case, the output signal stored in the output signal buffer 6 is transferred to the general-purpose computer 1 through the control circuit 2.

Figure 3:
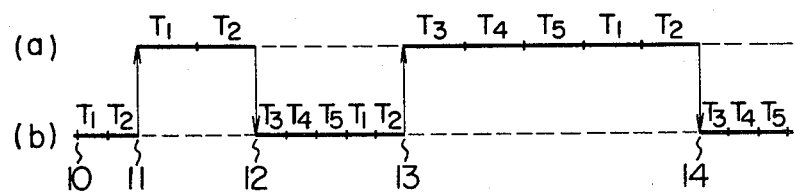
FIG. 3 is a timing chart for explaining the operation of the circuit of FIG. 2.

A time chart for explaining the operation of the circuit of FIG. 2 is shown in FIG. 3. In this time chart, (a) represents the flow of time in the general-purpose computer 1, and (b) represents the flow of operation time in the integrated circuit 4. The integrated circuit 4 can comprise, for instance, an Intel 8080 Microprocessor manufactured by the Intel Corporation which is configured to start and stop at predetermined timing intervals. In the example shown in FIG. 3, the timing intervals are 5 cycles from T1 to T5, with the start and stop operations being effected between the cycles T2 and T3.

In order to control the progress of the logic simulation, the clock provided in the logic simulation program of the general-purpose computer 1 is initialized at time point 10 while at the same time instructing the control circuit 2 to initialize (namely to reset the integrated circuit 4). In response to this instruction, the control circuit 2 resets and activates the integrated circuit 4, and returns the integrated circuit 4 to a stand-by state at cycle T2. In the meantime, the output signal of the integrated circuit 4 is accumulated in the output signal buffer 6 through the output signal register 5. At time point 11, the logic simulation program of the general-purpose computer 1 reads out the data from the output signal buffer 6 through the control circuit 2, and records it in the logic simulation program in accordance with the timing when the signal changes.

The logic simulation program effects the logic simulation of the simulation circuit over the cycles T1 and T2. The integrated circuit 4 holds the condition of time point 11 until the time point 12. When the clock of the logic simulation program advances to the fall point of the cycle T2 at time point 12, the general-purpose computer 1 transmits to the control circuit 2 the condition of the output node of the simulation circuit to be connected on the input side of the integrated circuit 4. The control circuit 2, after receiving this condition of the output node and setting it in the input signal register 3, activates the integrated circuit 4. The integrated circuit 4, upon application thereto of the data in the input signal register 3, performs a logic operation over cycles T3 to T2 for example between time points 12 and 13, and reaches stand-by state again at cycle T2. Between time points 12 and 13, the changes in the output signal are accumulated in the output signal buffer 6 through the output signal register 5 in the same manner as described for the previous process. On the other hand, the logic simulation program advances the clock and reads out the data from the output signal buffer 6 through the control circuit 2 at the rise point of the cycle T3 at time point 13, thus setting it into the logic simulation program. In other words, the data stored in the output signal buffer 6 are applied as a stimulus to the input node of the simulation circuit to be connected in the stage to be simulated subsequent to the integrated circuit 4. The logic simulation of the simulation circuit is executed by applying an output signal of the integrated circuit 4 corresponding to each cycle as a stimulus for the input node at each cycle. In other words, the logic operation of the integrated circuit 4 at cycles T3 to T2 during the time points 12 to 13 and the logic simulation of the simulation circuit at cycles T3 to T2 during the time points 13 to 14 coincide with each other in timing. At the next time point 14, the general-purpose computer 1 transmits to the control circuit 2 the condition of the output node of the simulation circuit by circuit simulation again. Subsequently, the same operations as that performed during the time points 12 to 13 and the logic simulation during the time points 13 to 14 are repeated on a time basis.

The time point when the integrated circuit 4 is to be de-energized after activation is determined as desired according to the integrated circuit involved. As mentioned above, in the case of a microprocessor such as an Intel 8080 Microprocessor, activation and de-activation may be effected at predetermined regular intervals of time. Generally, the integrated circuit 4 is de-energized at a time point before a new input signal is required for self operation.

I claim:

1. A method of logic simulation comprising the steps of:

(a) providing a real circuit among a logic circuit to be simulated as a part thereof, (b) forming a simulation model including said real circuit and a simulation circuit, (c) operating said real circuit at predetermined cycles, and buffering an output signal of said real circuit during said predetermined cycles in accordance with a time when the output signal changes, (d) subsequently executing the logic simulation of said simulation circuit over the same cycles as said predetermined cycles by using the output signal buffered in said step (c) as a stimulus to an input node of said simulation circuit, and (e) subsequently executing said step (c) in response to an input signal applied to said real circuit representing the condition of an output node of said simulation circuit which is obtained by the execution of said step (d) so that said real circuit operation and said simulation circuit operation alternate with one another.

2. A method of logic simulation according to claim 1, wherein in step (d) said stimulus is applied to the input node of said simulation circuit at a timing corresponding to the production of the output signal from said real circuit in accordance with the time when the output signal changes.

* * * * *